United States Patent [19]
Chambers et al.

[11] Patent Number: 5,459,427
[45] Date of Patent: Oct. 17, 1995

[54] DC LEVEL SHIFTING CIRCUIT FOR ANALOG CIRCUITS

[75] Inventors: Mark J. Chambers; Fatima D. Da Costa Seidel, both of Plantation, Fla.; Jesus P. Finol, Chandler, Ariz.; James B. Phillips, Plantation, Fla.

[73] Assignee: Motorola, Inc., Schaumburg, Ill.

[21] Appl. No.: 239,058

[22] Filed: May 6, 1994

[51] Int. Cl.⁶ .................................................. H03L 5/00
[52] U.S. Cl. ........................ 327/333; 327/539; 327/513; 326/62
[58] Field of Search ........................................ 327/306, 307, 327/333, 316, 317, 321, 322, 539, 540; 326/70, 73, 74

[56] References Cited

U.S. PATENT DOCUMENTS

| | | | |
|---|---|---|---|
| 3,801,831 | 4/1974 | Dame | 307/251 |
| 4,491,743 | 1/1985 | Smith | 307/264 |
| 4,527,078 | 7/1985 | Smith | 307/475 |
| 4,644,194 | 2/1987 | Birrittella et al. | 307/475 |
| 4,684,831 | 8/1987 | Kruest | 307/475 |
| 4,736,125 | 4/1988 | Yuen | 307/475 |
| 4,767,946 | 8/1988 | Taylor | 307/264 |
| 4,769,590 | 9/1988 | Taylor | 323/315 |
| 4,897,595 | 1/1990 | Holle | 323/314 |
| 4,918,398 | 4/1990 | Huijsing et al. | 330/252 |
| 4,937,477 | 6/1990 | Tsoi et al. | 307/475 |
| 4,968,905 | 11/1990 | Sanwo et al. | 307/475 |
| 4,978,871 | 12/1990 | Jordan | 307/475 |
| 4,987,327 | 1/1991 | Fernandez et al. | 307/491 |
| 5,087,834 | 2/1992 | Tsay | 307/443 |
| 5,140,196 | 8/1992 | Shepherd | 307/475 |
| 5,272,389 | 12/1993 | Hatada | 307/264 |
| 5,287,517 | 2/1994 | Maskas et al. | 307/475 |

*Primary Examiner*—Timothy P. Callahan
*Assistant Examiner*—Kenneth B. Wells
*Attorney, Agent, or Firm*—Donald C. Kordich; Pedro P. Hernandez

[57] ABSTRACT

A DC translation circuit (200) provides maximum dynamic range in DC level shifting that is temperature and process invariant. The DC translation circuit (200) includes a bandgap reference (202) and current mirror circuit (204) for providing a reference current, Iref. An op-amp circuit (210) receives an AC signal centered about a first DC level, and translates the first DC level into a second DC level using the reference current, a current mirror circuit (208), op-amp circuit (210) and resistor (R2).

4 Claims, 1 Drawing Sheet

DC LEVEL SHIFTING CIRCUIT FOR ANALOG CIRCUITS

TECHNICAL FIELD

This invention relates to communication devices, and more specifically to voltage level shifting circuits.

BACKGROUND

Voltage level shifting circuits are well known in the art. Level shifting circuits are used when interfacing different types of circuits to each other, such as when interfacing circuits operating at one particular voltage to circuits operating at another voltage level, for example when interfacing emitter coupled logic operating at a few hundred millivolts (ECL) to complementary metal oxide semiconductor (CMOS) circuits operating at several volts potential. Analog integrated circuits which operate on low single power supply voltage levels (e.g. Vcc=2.7 volts) typically use the half supply voltage (i.e., Vcc/2) as the midrange direct current (DC) reference for analog signal processing functions such as filters or amplifiers. The half supply voltage may not, however, be the reference level of choice for all signal processing functions within the same integrated circuit (IC). A problem of not getting enough signal swing when operating at low supply voltages (such as 1.8 V or 2.7 V) becomes apparent in the following example.

Referring to FIG. 1, an example of a prior art electronic CMOS circuit 100 using a typical N-channel metal oxide semiconductor-field effect transistor (NMOS-FET) differential pair circuit 102, 104 is shown. The differential pair (102, 104) is biased from voltage sources In (+) and In(−) each preferably equal to 0.9 volts DC for a supply voltage Vcc of preferably 1.8 volts. Assuming a gate-to source forward bias potential of 0.8 volts, the available negative dynamic range (i.e., AC amplitude) is only 100 millivolts (mV), whereas the available positive dynamic range is nearly Vcc/2 or 0.9 volts. The 100 mV negative dynamic range would cause clipping of an incoming AC signal having an amplitude greater than 100 mV. The maximum desired theoretical swing for the circuit 100 is, ±(100 mV+900 mV)/2=±500 mV. Thus, the optimum bias level for this particular circuit element is (Vcc/2)+0.4 volts or 1.3 volts DC. This yields a symmetrical AC dynamic range of ±500 millivolts (mV) which is a five-fold increase over the original 100 mV. A circuit that would provide precision DC level shifting (in this case +400 mV) would improve the dynamic signal swing of the circuit 100.

Other analog signal processing functions within the same IC may require a different optimum DC reference level than Vcc/2. Achieving the maximum dynamic range in an analog circuit is a primary design objective as this is equivalent to achieving a maximum signal-to-noise ratio performance. In a radio receiver, for example, achieving a maximum signal-to noise ratio permits the radio to either operate over greater distances or lower the required transmit power. These are fundamental system design goals. Thus, there is a need for a circuit that provides a precision DC level shift at the input of an analog element and a corresponding complementary level shift at the output which would permit all of the analog circuit functions to operate with a maximum dynamic range.

DETAILED DESCRIPTION OF THE PREFERRED EMBODIMENT

Figure 1:
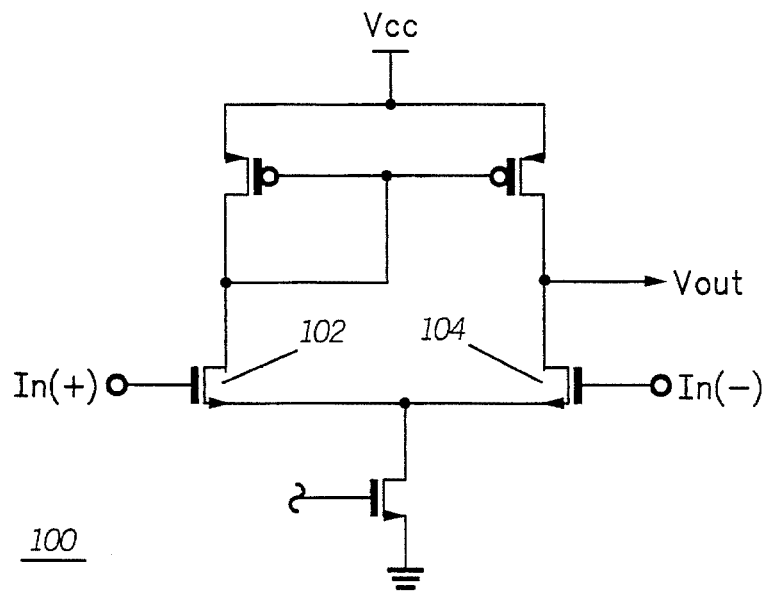
FIG. 1 shows a prior art electronic circuit.
Figure 2:
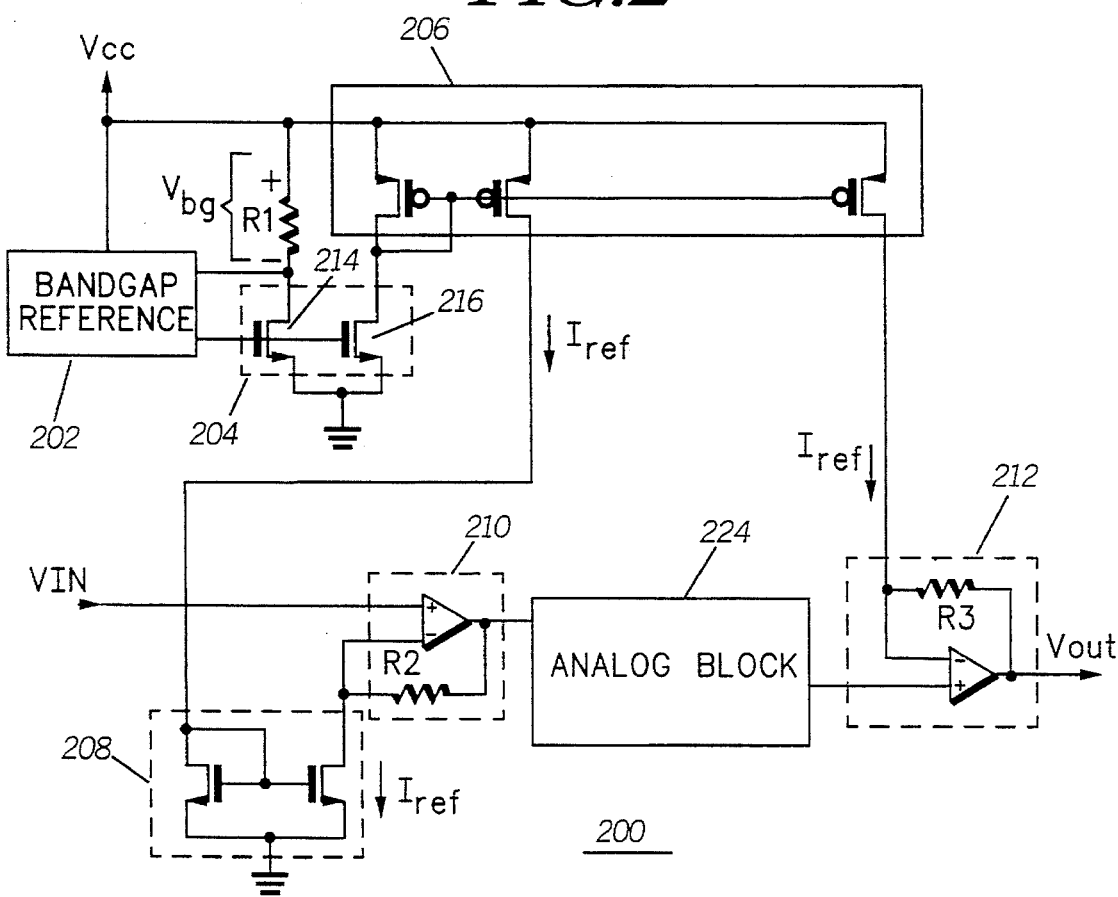
FIG. 2 shows a block diagram of a DC translation circuit in accordance with the present invention.

In FIG. 2 of the accompanying drawings, a detailed functional block diagram 200 of a precision CMOS DC translation circuit, or voltage level shifting circuit, in accordance with the present invention is shown. The circuit 200 employs a unique combination of a bandgap voltage reference 202 in conjunction with operational amplifier (op-amp) signal buffers 210, 212 and current mirror DC transmission elements 204, 206, and 208 to implement a precision input and output DC level translation to an analog circuit block 224, such as an analog filter or amplifier, used for signal processing.

In the preferred embodiment of the invention, the bandgap reference 202 produces a temperature and process invariant voltage, Vbg, of preferably 1.2 despite changes in Vcc. A reference current, Iref, is provided by a current source means which in the preferred embodiment is the bandgap voltage reference, Vbg, applied at resistor R1. Current mirror circuit 204 comprises transistors 214 and 216. Current mirror circuits 204 and 208 are preferably comprised of N-channel FETs while current mirror circuit 206 is preferably comprised of P-channel FETs. Reference current Iref to op-amp circuits 210 and 212 via current mirror circuits 206 and 208. In the preferred embodiment of the invention, the op-amp circuits 210 and 212 are operational amplifier buffer circuits which are used as individual DC translation means with the purpose of op-amp buffer circuit 210 being to shift the DC level up while op-amp buffer circuit 212 shifts the DC level down. The reference current Iref is given by the following equation:

$$Iref = Vbg/R1$$

The non-inverting input of op-amp 210 is biased by a signal received at terminal VIN which in the preferred embodiment is an AC signal with a DC offset, Vdc1. The op-amp circuits 210 and 212 enable an AC signal to be translated in a DC process. The op-amp circuit 210 has a feedback resistor R2 coupled between its output and the inverting input terminal of the op-amp. Current mirror circuit 208 provides a known path to ground potential (GND) for the reference current in op-amp buffer circuit 210, thereby transmitting the reference current to op-amp buffer 210 in a current sinking mode.

The circuit 200 uses the reference current Iref and offset voltage Vdc1 to set a second DC level Vdc2 at an input of the analog signal processing block 224. The reference current, Iref, produces, assuming the current mirror circuits transmit Iref without amplification; and the new intermediate DC reference level Vdc2, given by the following equation:

$$\begin{aligned} Vdc2 &= Vdc1 + Iref \times R2 \\ &= Vdc1 + Vbg \times (R2/R1). \end{aligned}$$

In the preferred embodiment, the resistors R1 and R2 are matched resistors (i.e., made from common resistor segments in the same type of resistor material). The new DC reference voltage Vdc2 is shifted by a constant DC voltage that is temperature and IC process invariant.

Next, a complementary shift is performed at the output of circuit 200. The output level shift is performed at op-amp buffer circuit 212 which includes a feedback resistor, R3. The reference current, Iref, is transmitted to the op-amp circuit 212 by current mirror 206 in a current sourcing mode.

The reference current Iref produces the output reference level Vdc3 given by the following equation:

$$Vdc3 = Vdc2 - Vbg \times (R3/R1)$$
$$= Vdc1 + Vbg \times ((R2 - R3)/R1).$$

In the preferred embodiment R2 is set equal to R3, the output DC reference level is the same as the input DC reference level thereby providing complementary level shifting to the analog signal processing block 224. Thus, this combined input and output DC level translation produces a new optimum DC reference level for the analog signal processing block 224.

In the preferred embodiment of the invention, the DC level is first shifted up at op-amp circuit 210 and then shifted down at op-amp circuit 212, however, an opposite shift could be achieved by re-configuring the current mirrors such that a current sourcing mode is used at op-amp circuit 210 while a current sinking mode is used at op-amp circuit 212. Independent level shifting from one circuit block to another can also be achieved by varying the values of resistors R2 and R3.

Resistor tolerances of the voltage level shifting circuit 200 will tend to track each other and the bandgap tolerance is tight therefore providing improved control of the level shifting. An aspect of the design as described by the invention, is the feature of utilizing the bandgap in conjunction with internal resistors and current mirrors to perform stable precision level shifting. The tracking characteristics of the resistors R1, R2, R3 make the DC translation circuit stable over temperature and process variations. By setting the resistors R2 and R3 to appropriate values, the rails for the voltage swing can be set by the DC level shift, which will permit all analog circuit functions to operate with a maximum dynamic voltage range. The reference current is preferably set by the bandgap voltage across an internal resistor and as a result a current which is inversely proportional to the value of that resistance is obtained.

Multiple stages of level shifters can be added to the DC translation circuit 200 by further mirroring of the current reference and adding more buffer stages under the control of feedback resistors. The DC translation circuit of the present invention solves the problem of providing sufficient voltage swing at low power supply voltages such as 2.7 V and 1.8 V where a reference other than half supply voltage may be desired. Because the reference current is set up by internal resistor and a bandgap reference, it tends to be impervious to changes in power supply voltages. An independent precision voltage level shift can be achieved from circuit block to circuit block by using the bandgap and current mirroring elements as described by the present invention. An individual analog reference can thus be set that is optimum for a given circuit block.

The DC translation circuit as described by the invention, can be used in other analog integrated circuit processes, such as bipolar and BiCMOS processes. It is especially applicable to signal power supply ICs which operate below 3 volts (such as 2.7 volts or 1.8 volts) These low voltage applications can be used in portable battery powered electronic products such as wireless telephone handsets. The ever increasing demand for products of this type creates the need for new circuit approaches such as the DC translation circuit as described by the invention that permit the continued utilization of high performance analog signal processing functions for low power supply voltage applications.

What is claimed is:

1. A direct current (DC) level shifting circuit for shifting a DC offset level of an input signal applied to an analog circuit, a power supply voltage being provided, the DC level shifting circuit comprising:

a first transistor;

a second transistor;

a first resistor coupled to the first transistor's drain;

a bandgap reference coupled with the first transistor's gate and drain and the second transistor's gate;

a DC transmission circuit, coupled with the second transistor's drain;

wherein the power supply voltage is applied to the DC transmission circuit, the bandgap reference, and the first resistor, whereby the bandgap reference creates a bandgap reference voltage across the first resistor, thus creating the reference current;

a first op-amp having a non-inverting input terminal for receiving the DC offset level, an inverting input terminal coupled with the DC transmission circuit, and an output terminal coupled with the analog circuit;

a second resistor coupled between the; first op-amp's output terminal and inverting input terminal;

a second op-amp having an inverting input terminal coupled with the DC transmission circuit, a non-inverting input terminal coupled with the analog circuit, and an output terminal; and a third resistor coupled between the second op-amp's output terminal and the inverting input terminal;

wherein the DC transmission circuit transmits the reference current to the first op-amp's inverting input terminal and to the second op-amp's inverting input terminal;

whereby, when the DC offset level is applied to the first op-amp's non-inverting input terminal, the first op-amp shifts the DC offset level to an intermediate DC reference level that is applied to the analog circuit, the analog circuit passes the intermediate DC reference level to the second op-amp's non-inverting input terminal, and the second op-amp shifts the intermediate DC reference level to an output DC reference level that is available at the second op-amp's output terminal.

2. The DC level shifting circuit of claim 1, wherein the DC transmission circuit includes:

a first current mirror circuit coupled with the first op-amp's inverting terminal; and a second current mirror circuit coupled with the second transistor's drain, the first current mirror circuit, and the second op-amp's inverting terminal such that the DC transmission circuit transmits the reference current to the first op-amp's inverting input terminal in a current sinking mode and transmits the reference current to the second op-amp's inverting input terminal in a current sourcing mode.

3. The DC level shifting circuit of claim 1, wherein the DC transmission circuit includes:

a first current mirror circuit coupled with the second op-amp's inverting terminal; and a second current mirror circuit coupled with the second transistor's drain, the first current mirror circuit, and the second op-amp's inverting terminal such that the DC transmission circuit transmits the reference current to the first op-amp's inverting input terminal in a current sourcing mode and transmits the reference current to the second op-amp's inverting input terminal in a current sinking mode.

4. The DC level shifting circuit of claim 1, wherein the second resistor and the third resistor are matched resistors.

* * * * *

UNITED STATES PATENT AND TRADEMARK OFFICE
CERTIFICATE OF CORRECTION

PATENT NO. : 5,459,427
DATED : October 17, 1995
INVENTOR(S) : Chambers, Mark J. et al.

It is certified that error appears in the above-indentified patent and that said Letters Patent is hereby corrected as shown below:

At column 2, line 24: after "Iref", please insert --is transmitted--.

At column 4, line 28 of claim 1: please delete the semicolon directly following the word "the".

Signed and Sealed this

Sixteenth Day of April, 1996

Attest:

BRUCE LEHMAN

Attesting Officer          Commissioner of Patents and Trademarks